US009537092B2

United States Patent
Zou et al.

(10) Patent No.: US 9,537,092 B2
(45) Date of Patent: Jan. 3, 2017

(54) INTEGRATED CIRCUITS WITH MEMORY CELLS AND METHODS OF MANUFACTURING THE SAME

(71) Applicant: GLOBALFOUNDRIES Singapore Pte. Ltd., Singapore (SG)

(72) Inventors: Zheng Zou, Singapore (SG); Alex See, Singapore (SG); Shyue Seng Tan, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 14/665,013

(22) Filed: Mar. 23, 2015

(65) Prior Publication Data
US 2016/0284991 A1    Sep. 29, 2016

(51) Int. Cl.
*H01L 45/00* (2006.01)
*H01L 27/24* (2006.01)

(52) U.S. Cl.
CPC ........... *H01L 45/06* (2013.01); *H01L 27/2409* (2013.01); *H01L 27/2463* (2013.01); *H01L 45/126* (2013.01); *H01L 45/1233* (2013.01); *H01L 45/1286* (2013.01); *H01L 45/1293* (2013.01); *H01L 45/144* (2013.01); *H01L 45/16* (2013.01)

(58) Field of Classification Search
CPC .. H01L 45/06; H01L 45/1286; H01L 45/1233; H01L 27/24; H01L 27/2409; H01L 45/144; H01L 27/2463
See application file for complete search history.

(56) References Cited

U.S. PATENT DOCUMENTS

| 2004/0026686 A1* | 2/2004 | Lung | H01L 45/06 257/30 |
|---|---|---|---|
| 2005/0231887 A1* | 10/2005 | Zandi | H01L 21/6833 361/234 |
| 2006/0110878 A1* | 5/2006 | Lung | H01L 27/112 438/253 |
| 2007/0008866 A1* | 1/2007 | Adams | B82Y 10/00 369/126 |
| 2007/0291533 A1* | 12/2007 | Chuo | H01L 45/06 365/163 |
| 2010/0006814 A1* | 1/2010 | Chen | H01L 45/06 257/4 |
| 2010/0117050 A1* | 5/2010 | Chen | H01L 27/24 257/4 |
| 2014/0070162 A1* | 3/2014 | Iwayama | H01L 43/08 257/4 |
| 2014/0166965 A1* | 6/2014 | Seo | H01L 45/124 257/4 |

(Continued)

FOREIGN PATENT DOCUMENTS

KR    2010001973 A  *  2/2010

*Primary Examiner* — Michele Fan
(74) *Attorney, Agent, or Firm* — Lorenz & Kopf, LLP

(57) ABSTRACT

Integrated circuits and methods for manufacturing the same are provided. An integrated circuit includes a lower electrode overlying a substrate, an insulating layer overlying the lower electrode, and an upper electrode overlying the insulating layer. The lower electrode, the insulating layer, and the upper electrode form a stack having a side surface. A phase change spacer is adjacent to the side surface, where the phase change spacer is electrically connected to the lower electrode and the upper electrode.

16 Claims, 9 Drawing Sheets

(56) References Cited

U.S. PATENT DOCUMENTS

2014/0198553 A1\* 7/2014 Lung .................. G11C 13/0004
　　　　　　　　　　　　　　　　　　　　　365/63
2014/0291603 A1\* 10/2014 Song .................. H01L 45/1616
　　　　　　　　　　　　　　　　　　　　　257/4

\* cited by examiner

INTEGRATED CIRCUITS WITH MEMORY CELLS AND METHODS OF MANUFACTURING THE SAME

TECHNICAL FIELD

The technical field generally relates to integrated circuits with memory cells and methods for manufacturing the same, and more particularly relates to integrated circuits with vertical memory cells using a phase change material and methods of manufacturing such integrated circuits.

BACKGROUND

The semiconductor industry is continuously moving toward the fabrication of smaller and more complex microelectronic components with higher performance. Memory cells are an important part of many microelectronic components, and smaller and more reliable memory cells are desirable. One type of memory cell is a non-volatile and re-writable memory cell. Non-volatile memory cells retain stored information even when the memory cell is de-powered, and stored information can be changed when the memory cell is re-writable. Some non-volatile, re-writable memory cells store information using a phase change material, where the phase change material has two stable states with different properties. For example, the two stable states may be different stable atomic lattice states. The varying property of the non-volatile, re-writable memory cell can be measured to determine its' state. For example, germanium antimony tellurium (GeSbTe, or more commonly GST) has a stable crystalline state and a stable amorphous state, with the respective states having different electrical resistivities. The state of the GST can be changed with controlled temperature variations, and the resistance or resistivity of the GST memory cell can be measured to determine if the GST material is in the crystalline or amorphous state. One state is equated with a "0," and the other state is equated with a "1," as is typical for memory cells.

Many GST memory cells are horizontal, where the GST material is positioned between a first and second electrode, and the GST material and first and second electrodes are all on the same level. However, the horizontal structure occupies a large footprint that is not conducive to the fabrication of smaller integrated circuits. Some vertical GST memory cells include an upper and lower electrode with the GST material positioned therebetween, but the GST material has a large cross-sectional area between the upper and lower electrodes. The temperature changes used to switch the GST material between the different states are produced by inducing a current through the GST material to generate heat. The large cross-sectional area requires a high current density to produce the required temperatures for phase change between the two states. This high current density drains power and is undesirable in integrated circuits.

Accordingly, it is desirable to provide integrated circuits and methods of manufacturing integrated circuits using phase change memory cells that occupy a small footprint. In addition, it is desirable to provide integrated circuits and methods of forming them with a phase change memory cell that requires a small current density to control a change in the phase change material. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for manufacturing the same are provided. In an exemplary embodiment, an integrated circuit includes a lower electrode overlying a substrate, an insulating layer overlying the lower electrode, and an upper electrode overlying the insulating layer. The lower electrode, the insulating layer, and the upper electrode form a stack having a side surface. A phase change spacer is adjacent to the side surface, where the phase change spacer is electrically connected to the lower electrode and the upper electrode.

A method for manufacturing an integrated circuit is provided in another embodiment. The method includes forming a stack overlying a substrate, where the stack includes an insulating layer overlying a lower electrode. The stack is formed into a row, and a phase change spacer including a phase change material is formed adjacent to the row. The phase change spacer is electrically connected to the lower electrode. The row is divided into a plurality of memory cells after forming the phase change spacer.

A method for manufacturing an integrated circuit is provided in yet another embodiment. A stack is formed overlying a substrate, where the stack includes an upper electrode overlying an insulator that in turn overlies a lower electrode. The stack is formed into a row, and a heater spacer is formed adjacent to the row in electrical connection with the lower electrode. A portion of the heater spacer is removed from adjacent to the upper electrode with the heater spacer remaining electrically connected to the lower electrode. A phase change spacer is formed adjacent to the stack and overlying the heater spacer, where the phase change spacer is electrically connected to the upper electrode and to the heater spacer. The row is divided into a plurality of memory cells after forming the phase change spacer.

BRIEF DESCRIPTION OF THE DRAWINGS

The present embodiments will hereinafter be described in conjunction with the following drawing figures, wherein like numerals denote like elements, and wherein:

FIGS. 1, 3, 7, and 8 are plan views, FIGS. 2, 4-6, 10, and 11 are side sectioned views, and FIG. 9 is a perspective view.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor components are well-known and so, in the interest of brevity, many conventional steps will only be mentioned briefly herein or will be omitted entirely without providing the well-known process details.

According to various embodiments described herein, memory cells are formed overlying a substrate. The memory cells include a stack having an upper electrode overlying an insulating layer, which in turn overlies a lower electrode. A phase change spacer is formed along one or more side surfaces of the stack, where the horizontal cross sectional area of the phase change spacer is less than the horizontal cross sectional area of the stack. The stack and the phase change spacer form a memory cell. The phase change spacer is electrically connected to the upper and lower electrodes, so the phase change memory cell is vertical but has a reduced cross sectional area for the phase change material.

Figure 1:
FIGS. 1-11 illustrate an integrated circuit and methods for is fabrication in accordance with exemplary embodiments, where
Figure 2:
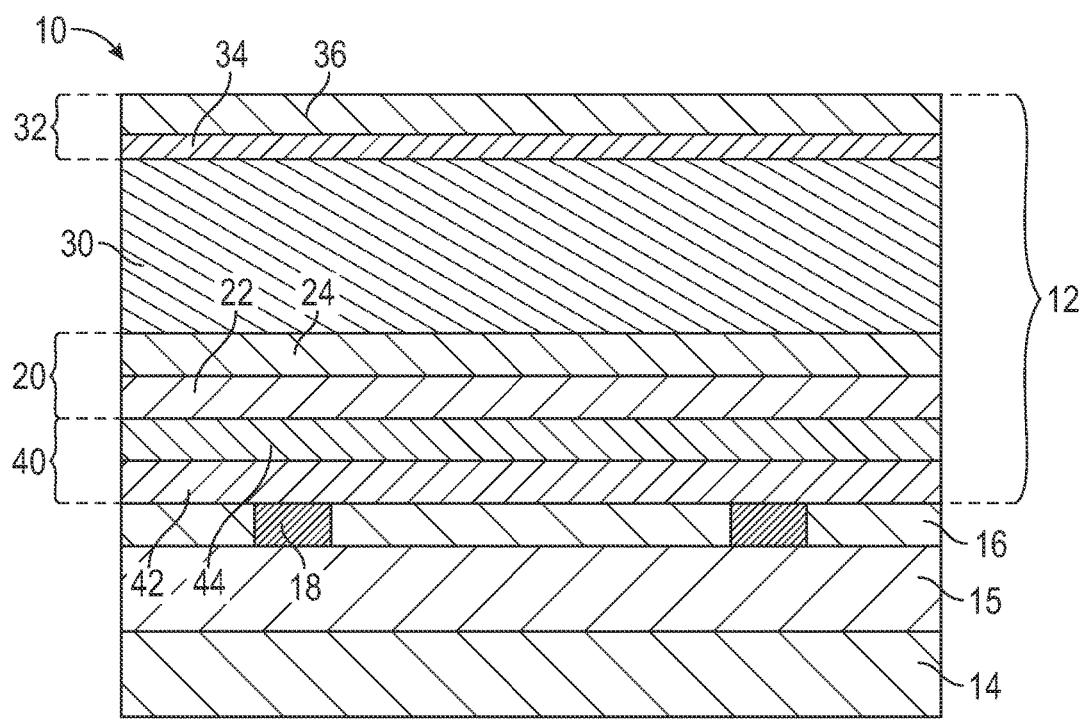

Reference is made to the exemplary embodiment illustrated in FIGS. 1 and 2, where FIG. 1 is a plan view and FIG. 2 is a cross sectional view. FIG. 1 illustrates a top surface of a stack 12, which is initially formed overlying a wide area of a substrate 14 in an exemplary embodiment. FIG. 2 illustrates the layers and features of the substrate 14 and stack 12 in an exemplary embodiment. An integrated circuit 10 includes the stack 12 formed overlying the substrate 14. As used herein, the term "overlying" means "over" such that an intervening layer may lay between the substrate 14 and the stack 12, and "on" such the substrate 14 physically contacts the stack 12. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer.

An electrical contact is formed to a bottom surface of the stack 12, and several options for the electrical contact are possible. In an exemplary embodiment, a connecting line 15 is formed in electrical contact with the bottom surface of the stack 12. The connecting line 15 may be embedded in the substrate 14 or overlying the substrate 14 in various embodiments. The connecting line 15 is a conductive material, and each individual stack 12 may have a separate connecting line 15, or share a connecting line 15 with one or more other stacks 12 (as illustrated). In an exemplary embodiment, the connecting line 15 is metallic, such as a copper material, which may be deposited within a trench formed in the substrate 14 by electroless deposition, electroplating, or other techniques. A copper seed layer (not illustrated) may be deposited with the connecting liner 16. The connecting line 15 may serve as an electrical ground, or it may serve as a charged line in various embodiments. The stack 12 may optionally be electrically isolated from the substrate 14, such as with an isolation layer 16. The isolation layer 16 is an insulating material, which may include silicon dioxide, silicon nitride, or a wide variety of insulating materials. In an exemplary embodiment, the isolation layer 16 includes silicon dioxide formed by chemical vapor deposition using silane and oxygen. In embodiments with an isolation layer 16, a base layer contact 18 may be formed through the isolation layer 16 to electrically connect the connecting line 15 with the stack 12. The base layer contact 18, if present, is formed of an electrically conductive material using known techniques.

The stack 12 is formed overlying the substrate 14, the connecting line 15, and the base layer contact 18 (if present). The stack 12 includes a lower electrode 20, an insulating layer 30 overlying the lower electrode 20, and an upper electrode 32 overlying the insulating layer 30. The stack 12 may also include an optional base layer 40 underlying the lower electrode 20. The base layer 40 includes an N-polysilicon layer 42 and a P-polysilicon layer 44 that can aid in controlling the direction of current flow between the connecting line 15 and the stack 12. The N- and P-polysilicon layers 42, 44 form a P-N junction that allows current to flow in only one direction. This reduces short circuits between adjacent stacks 12, and faulty signal reading arising from such short circuits. In the embodiment illustrated, the P-polysilicon layer 44 overlies the N-polysilicon layer 42, but the reverse may be the case in alternate embodiments. The N- and P-polysilicon layers 42, 44 may be formed by low pressure chemical vapor deposition (LPCVD) using silane, where conductivity determining ions are included in the LPCVD. The conductivity determining ions may be implanted after the polysilicon of the N- and/or P-polysilicon layers 42, 44 are formed in alternate embodiments. The N-polysilicon layer 42 includes "N" type conductivity determining ions such as phosphorous, arsenic, and/or antimony, and the P-polysilicon layer 44 includes "P" type conductivity determining ions such as boron, aluminum, gallium, and/or indium. The base layer 40 is electrically connected to the lower electrode 20, and the connecting line 15 is electrically connected to the lower electrode 20 through the base layer 40.

The lower electrode 20 is formed from an electrically conductive material, and a wide variety of electrically conductive materials can be used in alternate embodiments. In an exemplary embodiment, the lower electrode 20 includes a lower metallic layer 22 and a lower phase change layer 24 overlying the lower metallic layer 22. The lower metallic layer 22 may be copper, which can be formed overlying the substrate 14, the connecting line 15, and the base layer 40 by electroless deposition, electroplating, or other techniques. A copper seed layer (not illustrated) may be deposited to aid in the formation of the lower metallic layer 22. The lower phase change layer 24 may include germanium-antimony-tellurium (GeSbTe or GST). The GST may be formed by metalorgainc chemical vapor deposition using isobutylgermane (IBGe), tris-dimethylamino antimony (TDMASb), and di-isopropyl telluride (DIPTe), but other precursors or other deposition methods may also be used. The GST layer is formed in the crystalline state, which has a lower resistivity than the amorphous state.

The insulating layer 30 may be formed overlying the lower electrode 20, where the insulating layer 30 electrically separates the upper and lower electrodes 32, 20. The insulating layer 30 is an insulating material, where an insulating material generally has a resistivity of about $1 \times 10^4$ ohm meters or more, and a conductive material generally has a resistivity of about $1 \times 10^{-4}$ ohm meters or less. A wide variety of insulating materials can be used in various embodiments, and the insulating layer 30 may include one, two, or more layers of the same or different insulating materials. In an exemplary embodiment, the insulating material of the insulating layer 30 is silicon dioxide, which can be deposited by chemical vapor deposition using silane and oxygen. The insulating layer 30 may be about 20 to about 1,000 nanometers thick in some embodiments, but other thicknesses are also possible.

The upper electrode 32 is formed overlying the insulating layer 30, where the upper electrode 32 is an electrically conductive material. A wide variety of electrically conductive materials can be used in the upper electrode 32 in various embodiments, and the upper electrode 32 may include one, two, or more layers of the same or different materials. In the exemplary embodiment illustrated, the upper electrode 32 is initially formed to include an upper phase change layer 34 and an upper dielectric layer 36 overlying the upper phase change layer 34. The upper dielectric layer 36 is a temporary placeholder, or a "dummy" layer, that is replaced with a conductive material at a later stage described below. As such, the upper dielectric layer 36 is formed in the location of the upper electrode 32, but the upper dielectric layer 36 is not a component of the final upper electrode 32. The upper dielectric layer 36 may be silicon nitride, which can be formed by low pressure chemical vapor deposition using ammonia and dichlorosilane, but many other materials can be used in alternate embodiments. The upper dielectric layer 36 may even be an electrically conductive material in some embodiments, or the upper dielectric layer 36 may not be present in other embodiments. The upper phase change layer 34 may be formed as described above.

Figure 3:
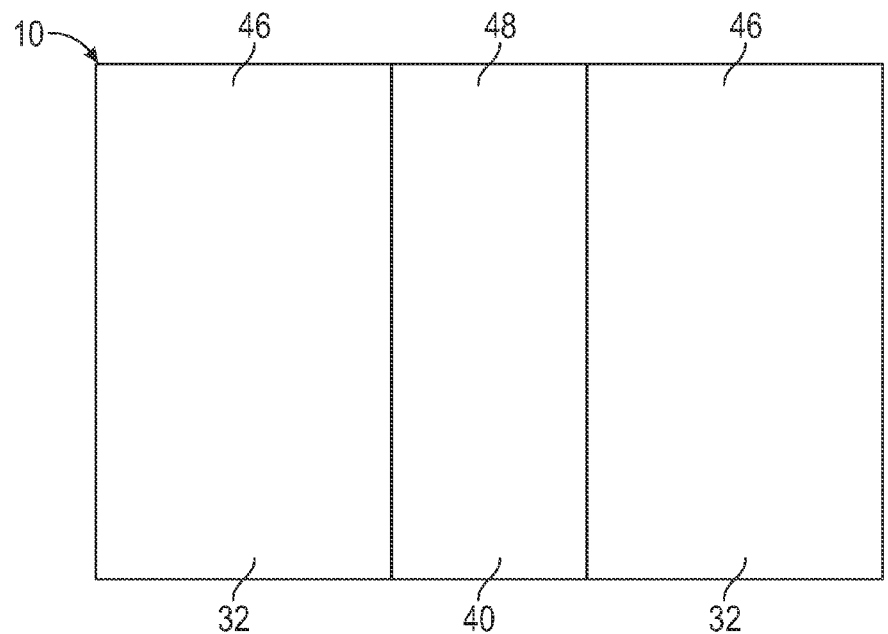
Figure 4:
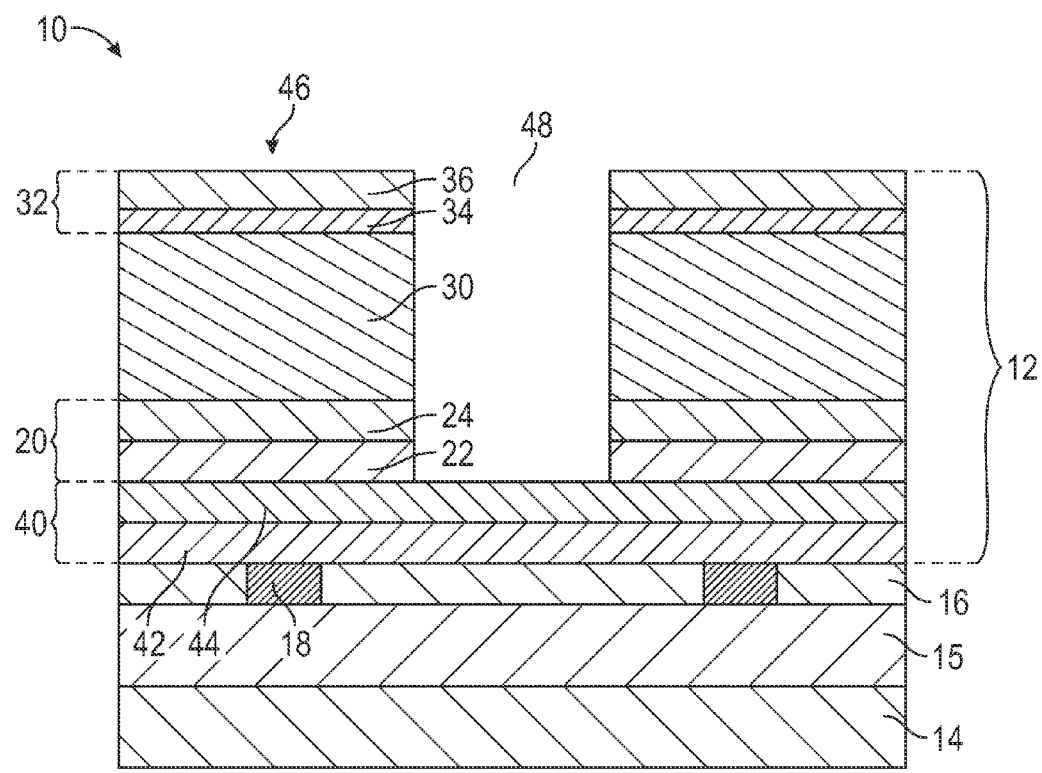

Referring to FIGS. 3 and 4, the stack 12 is formed into a plurality of rows 46 with a plurality of valleys 48 defined between adjacent rows 46. FIG. 3 is a plan view, and FIG. 4 is a cross sectional view showing the various layers in an exemplary embodiment. The row 46 may be formed using lithography and anisotropic etching, as is understood by those skilled in the art. The valley 48 may be etched by a timed reactive ion etch using a chlorine based etchant such as chlorine gas or boron trichloride, but in alternate embodiments the valley 48 may be formed by a series of anisotropic etches selective to the material of the layer being etched. The valley 48 may be formed through the upper electrode 32, the insulating layer 30, and the lower electrode 20, such that the base layer 40 remains at the bottom of the valley 48. The rows 46 are formed by removing all or a portion of the stack 12. For example and as illustrated in FIG. 4, the valley 48 is formed between the upper and lower electrodes 32, 20 and the insulating layer 30 of the stack 12, but is not formed from the base layer 40 of the stack 12. The valley 48 may also include the base layer 40 in alternate embodiments, or at later manufacturing stages.

Figure 5:
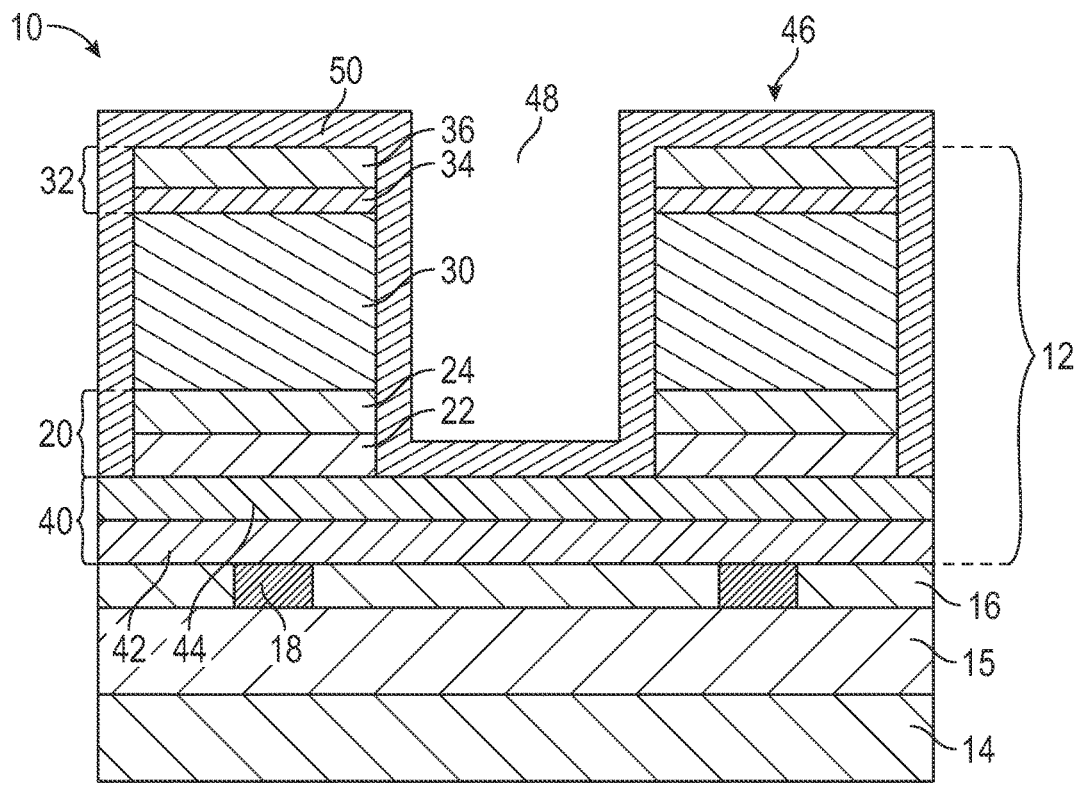
Figure 6:
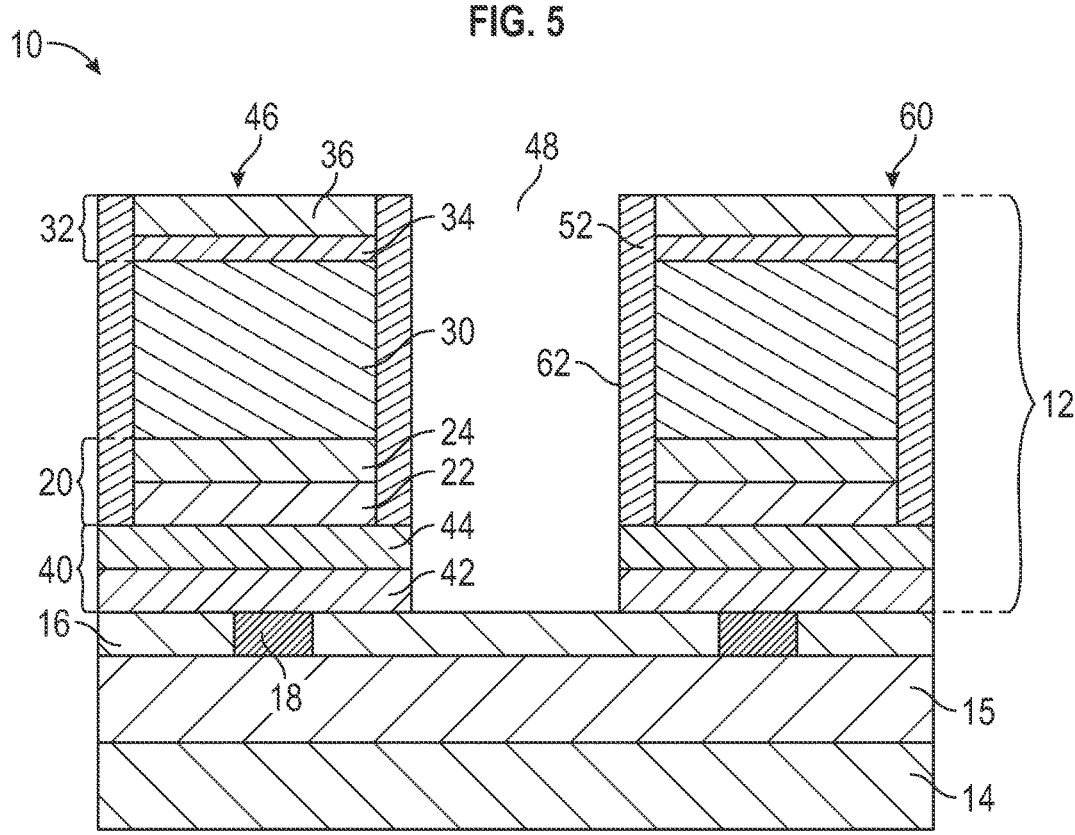

A phase change spacer precursor layer 50 is formed overlying the stack 12 and the base layer 40, as illustrated in an exemplary embodiment in FIG. 5. The phase change spacer precursor layer 50 may be GST material, which can be deposited as described above. The phase change spacer precursor layer 50 is then removed from over the horizontal surfaces to leave a phase change spacer 52 adjacent to the stack 12, as illustrated in FIG. 6 with continuing reference to FIG. 5. As such, the phase change spacer 52 is electrically connected to the upper and lower electrodes 32, 20. The phase change spacer precursor layer 50 may be removed from horizontal surfaces with an anisotropic etch, such as a dry reactive ion etch using a mixture of carbon tetrafluoride and argon. The etch process that removes the horizontal surfaces of the phase change spacer precursor layer 50 may be extended to remove the base layer 40 from the bottom of the valley 48, or a separate etch may be used to remove the base layer 40 from the bottom of the valley 48. A reactive ion etch with hydrogen bromide may be used for the base layer 40, but other etchants are also possible. The base layer 40 remains under the stack 12, because the stack 12 protects the underlying base layer 40 during the etching process. The phase change spacer 52 is formed along the side surfaces 62 of the stack 12, or at least along a portion of the side surface 62 of the stack 12 as illustrated in a plan view in FIG. 7, so each row 46 has a phase change spacer 52 on opposite sides. The phase change spacer 52 is not formed along the portion of the stack side surface 62 adjacent to the base layer 40.

Figure 7:
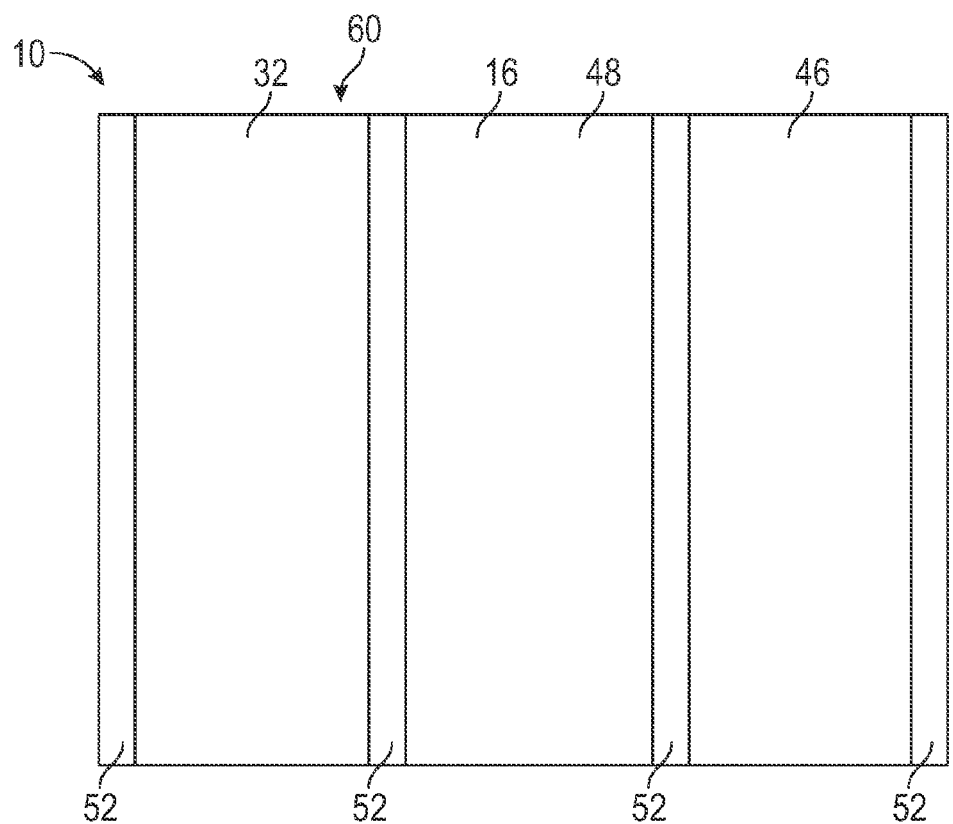
Figure 8:
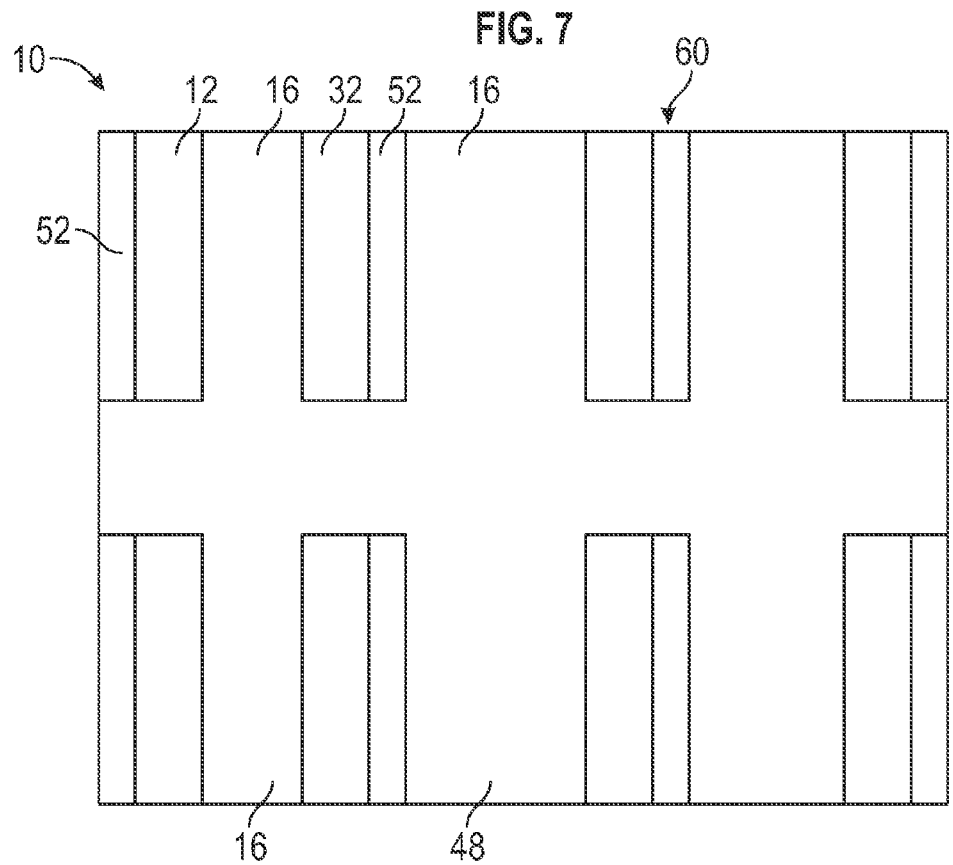
Figure 9:
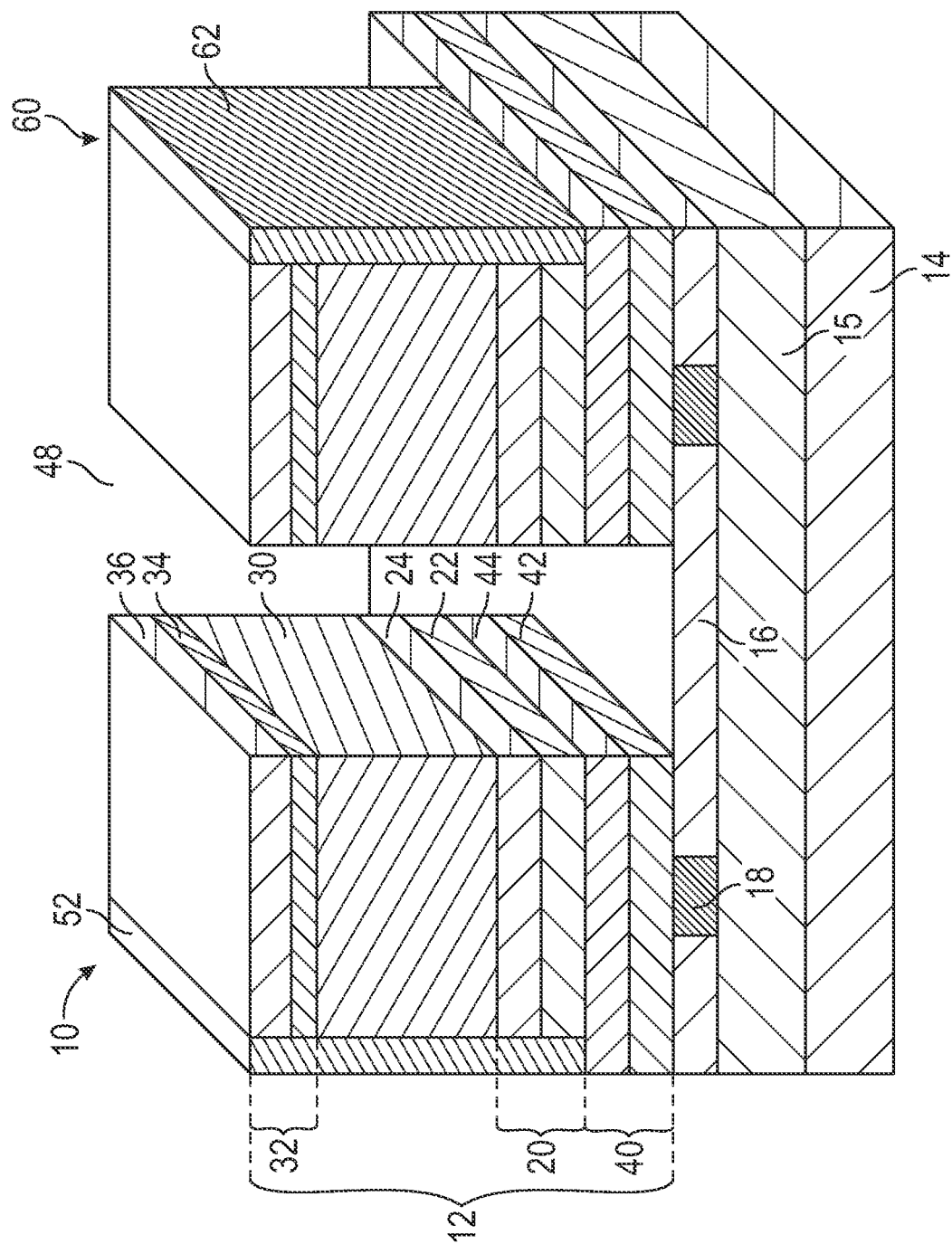

Reference is made to the exemplary embodiment illustrated in a plan view in FIG. 8, with continuing reference to FIG. 7. The row 46 is divided into a plurality of memory cells 60, where the memory cell 60 includes the stack 12 and the phase change spacer 52. A cut mask (not illustrated) and lithography is used to expose the portions of the row 46 that are removed to form the plurality or memory cells 60. In an exemplary embodiment, the row 46 is cut lengthwise and crosswise, so the stack 12 in each memory cell has four side surfaces 62, as seen in FIG. 9. In alternate embodiments, the row 46 may be cut in other manners, so the memory cell 60 may have a non-rectangular shape when viewed from the top. The row 46 is cut through the base layer 40 to the isolation layer 16, such as with a non-isotropic reactive ion etch, as described above. As such, the base layer 40 is positioned between the connecting line 15 and the phase change spacer 52. Therefore, the phase change spacer 52 is electrically isolated from the connecting line 15 by the base layer 40. The base layer 40 is less electrically conductive than the lower electrode 20 in some embodiments, so the electrical current tends to flow between the lower electrode 20 and the phase change spacer 52 far more than between the base layer 40 and the phase change spacer 52. The larger horizontal cross sectional area of the lower electrode 20 facilitates greater current flow between the connecting line 15 and the lower electrode 20 than between the connecting line 15 and the phase change spacer 52. As such, the base layer 40 effectively insulates the phase change spacer 52 from the connecting line 15. The row 46 may be cut in one, two, or more steps, such as a first step with a lengthwise cut and a second step with a crosswise cut, but in some embodiments all the cuts are made in a single step. In some embodiments, the memory cell 60 has a phase change spacer 52 adjacent to exactly one side surface 62 after the row 46 is cut.

Figure 10:
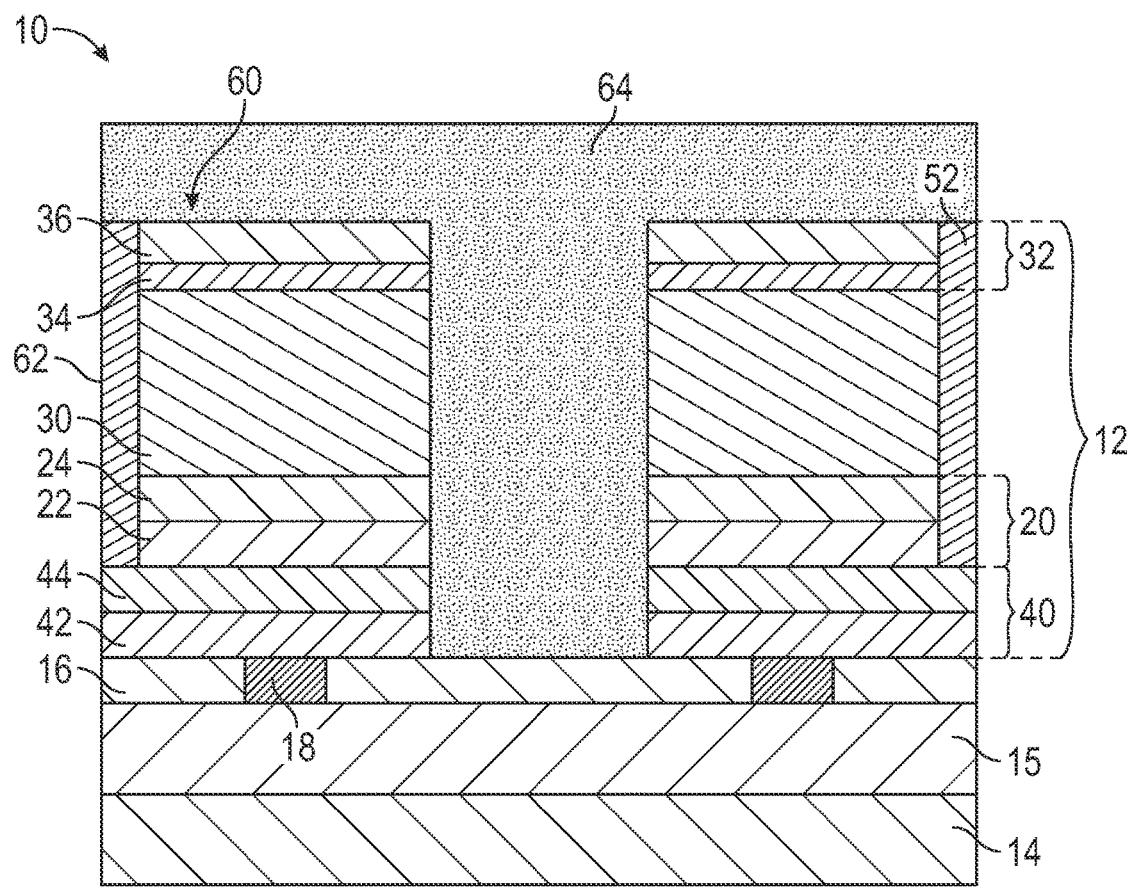
Figure 11:
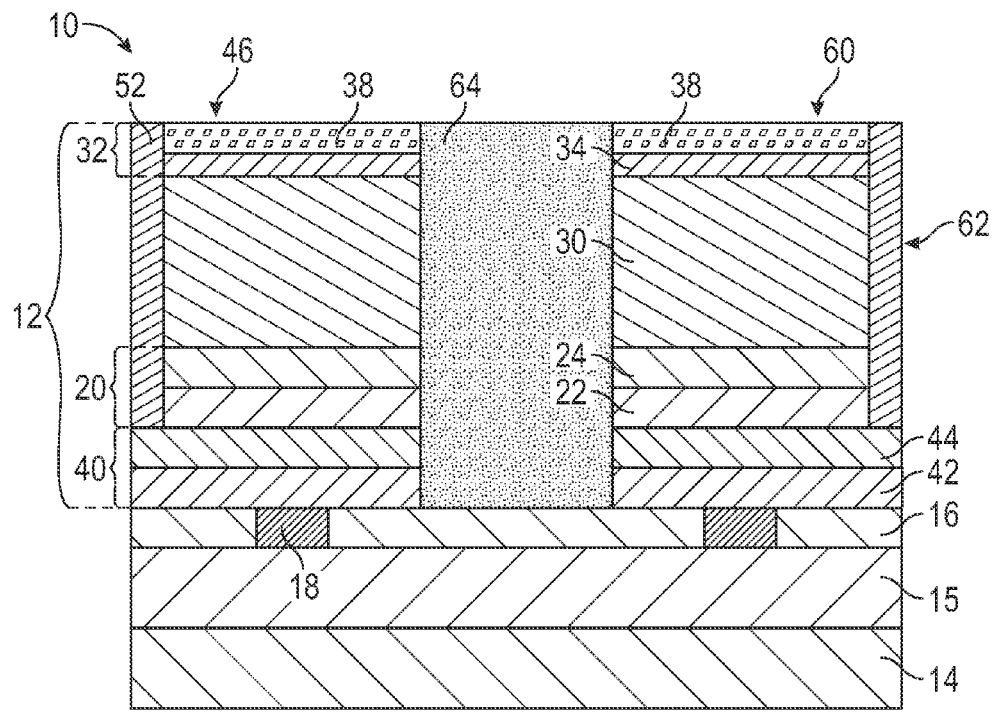

Referring to the exemplary embodiment illustrated in FIG. 10, a cover layer 64 is formed overlying the substrate 14 and the stack 12. The cover layer 64 is an electrically insulating material, and may include silicon dioxide in an exemplary embodiment. The cover layer 64 may be formed as described above. In an exemplary embodiment illustrated in FIG. 11, with continuing reference to FIG. 10, an upper portion of the cover layer 64 is removed to expose the upper dielectric layer 36 of the upper electrode 32, such as by chemical mechanical planarization. The upper dielectric layer 36 may then be selectively removed to form an upper gap (not illustrated), such as with a wet etch using hot phosphoric acid in embodiments where the upper dielectric layer 36 is silicon nitride and the cover layer 64 includes silicon oxide. The material of the cover layer 64 may be selected to allow for selective removal of the upper dielectric layer 36 without removal of the cover layer 64. The upper gap, which is the space left by the removed upper dielectric layer 36, can then be filled with an upper metallic layer 38 to complete the formation of the upper electrode 32 using conductive materials. For example, the upper metallic layer 38 may be formed of copper, which may be deposited as described above, and where the overburden may then be removed. Many other metals can be used in the upper metallic layer 38 in alternate embodiments. The upper metallic layer 38 is electrically connected to the upper phase change layer 34 and the phase change spacer 52. Electrical contacts (not illustrated) may then be formed that electrically connect with the upper electrode 32. Current can then be passed between the upper electrode 32 through the phase change spacer 52 to the lower electrode 20, then through the base layer 40 and finally to the connecting line 15. The memory cell 60 can then be incorporated into an integrated circuit 10, as understood by those skilled in the art.

The horizontal cross sectional area of the phase change spacer 52 is significantly less than the horizontal cross sectional area of the memory cell 60, such as about 20 percent or less of the horizontal cross sectional area of the memory cell 60, so less current is required to heat the phase change spacer 52 than would be required to heat a phase change layer that filled the space between the upper and lower electrodes 32, 20. The phase change spacer 52 has some resistivity, so it heats when current is passed through it. The amount of current can be adjusted to increase the temperature of the phase change spacer 52 to control the state. For example, a short burst of high current can be used to bring the phase change material of the phase change spacer 52 to about its melting point, which may be about 600 degrees centigrade (° C.) but can vary depending composition, impurities, and other factors. The phase change material is then allowed to quickly cool and form the amorphous state, which is the high resistivity state for the GST material. Alternatively, a lower current applied for a longer duration can heat the phase change spacer 52 to from about 100° C. to about 150° C., and the longer duration allows the phase change material to grow crystals for the crystalline state, which is the lower resistivity state for the GST material. The resistivity across the memory cell 60 can then be measured using standard methods to read the memory based on the state of the phase change spacer 52. The GST phase change material is stable in both the high and low resistivity states. For example, the GST material may be stable in the high or the low resistivity state at temperatures of about 50° C. or less, or at temperatures of about 80° C. or less.

Figure 12:
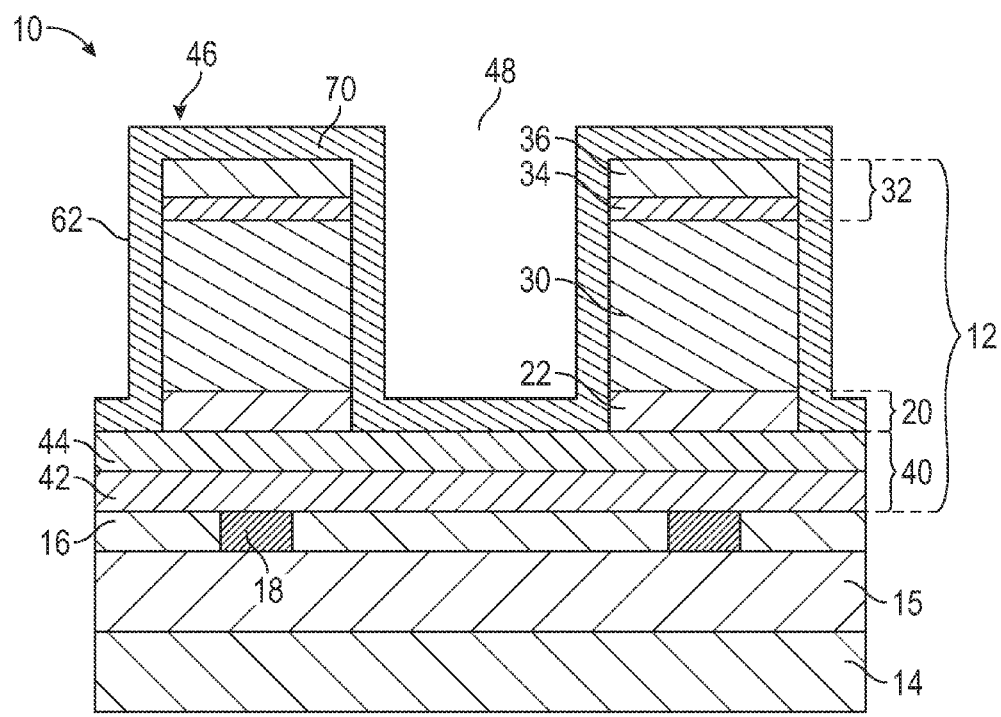
FIGS. 12-16 are side sectional views of other embodiments of an integrated circuit and methods for its fabrication.

An alternate embodiment is illustrated in FIG. 12, with further reference to FIGS. 3 and 4. The stack 12 in this embodiment is formed with a lower metallic layer 22 in the lower electrode 20, but the lower electrode 20 does not include a lower phase change layer 24. As mentioned above, the lower electrode 20 (and the upper electrode 32) is formed of a conductive material, and a wide variety of materials or combination of materials may be used in various embodiments. A heater layer 70 is formed overlying the base layer 40 and the stack 12, where the heater layer 70 includes a material with a higher resistivity than the phase change material when the phase change material is in the low resistivity state (the crystalline state for GST material). In an exemplary embodiment, the heater layer 70 includes a high resistance metal, such as tungsten. Tungsten can be deposited by physical vapor deposition.

Figure 13:
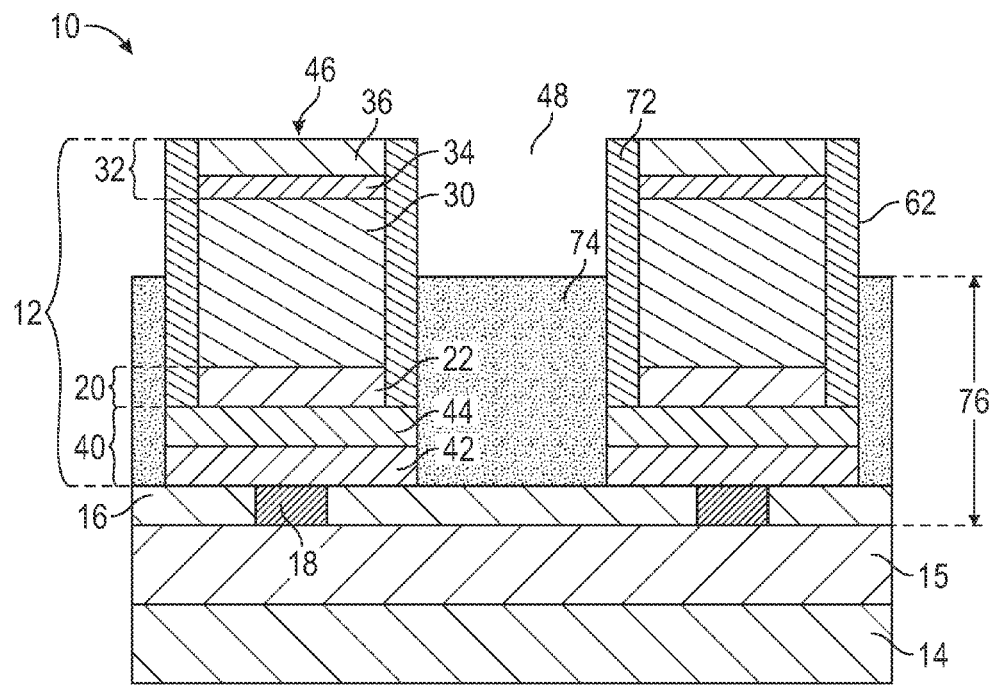

Referring to FIG. 13 with continuing reference to FIGS. 3 and 4, the horizontal portions of the heater layer 70 are removed to form a heater spacer 72 adjacent to the row 46. In an exemplary embodiment with a heater layer 70 including tungsten, the horizontal portions of the heater layer 70 can be removed with an anisotropic reactive ion etch using a fluorine-based etchant such as carbon tetrafluoride, but other etchants can also be used. The heater spacer 72 is electrically connected to the lower electrode 20 along the stack side surface 62. The base layer 40 at the bottom of the valley 48 is also removed, as described above for the phase change spacer 52. A heater insulator 74 is then deposited overlying the substrate 14 and the stack 12, and the heater insulator 74 is recessed to a heater height over the substrate 14 indicated by the double headed arrow labelled 76. The heater height 76 is intermediate between the lower electrode 20 and the upper electrode 32, so the insulating layer 30 includes a horizontal cross section at the heater height 76. As such, the heater height 76 is within the height of the insulating layer 30. The heater insulator 74 may be silicon dioxide that is formed as described above, but other insulating materials can also be used. The heater insulator 74 can be recessed to the heater height 76 with a timed wet etch using dilute hydrofluoric acid, but the heater insulator 74 can be recessed using other methods. The heater insulator 74 may include a different material than the upper dielectric layer 36, so the heater insulator 74 can be selectively recessed without removing the upper dielectric layer 36. In the embodiment described above, the heater insulator 74 includes silicon dioxide and the upper dielectric layer 36 includes silicon nitride, which allows for selective removal of either component. However, a wide variety of materials can be used for the upper dielectric layer 36 and the heater insulator 74 such that the heater insulator 74 can be selectively recessed without removal of the upper dielectric layer 36. The heater insulator 74 may also be a material that can be selectively recessed without removal of the heater spacer 72 or other exposed components.

Figure 14:
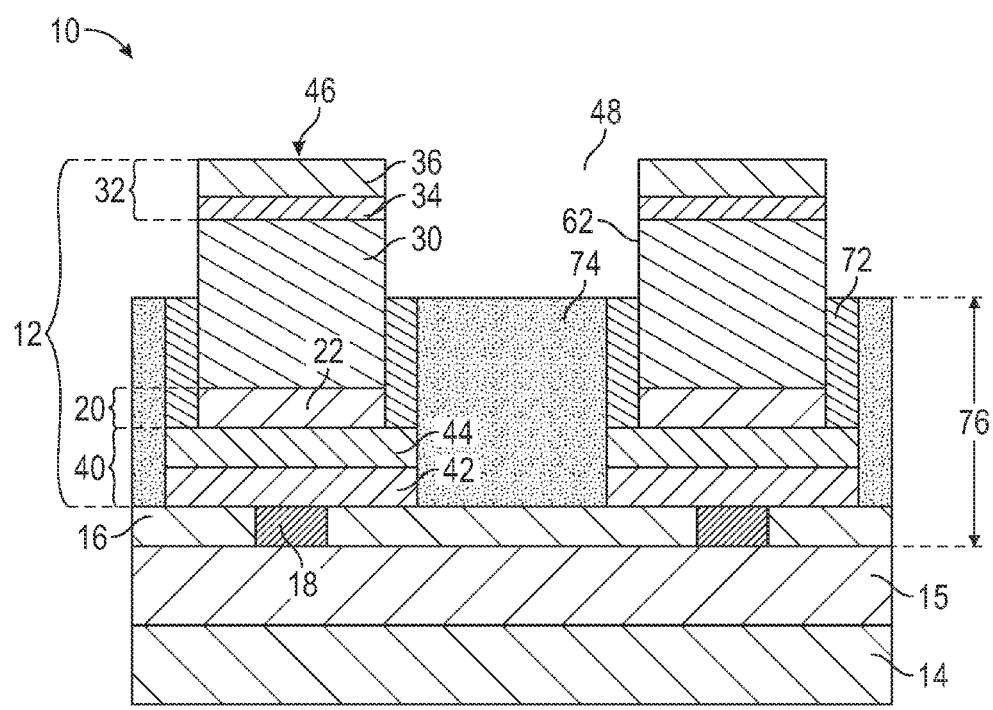
Figure 15:
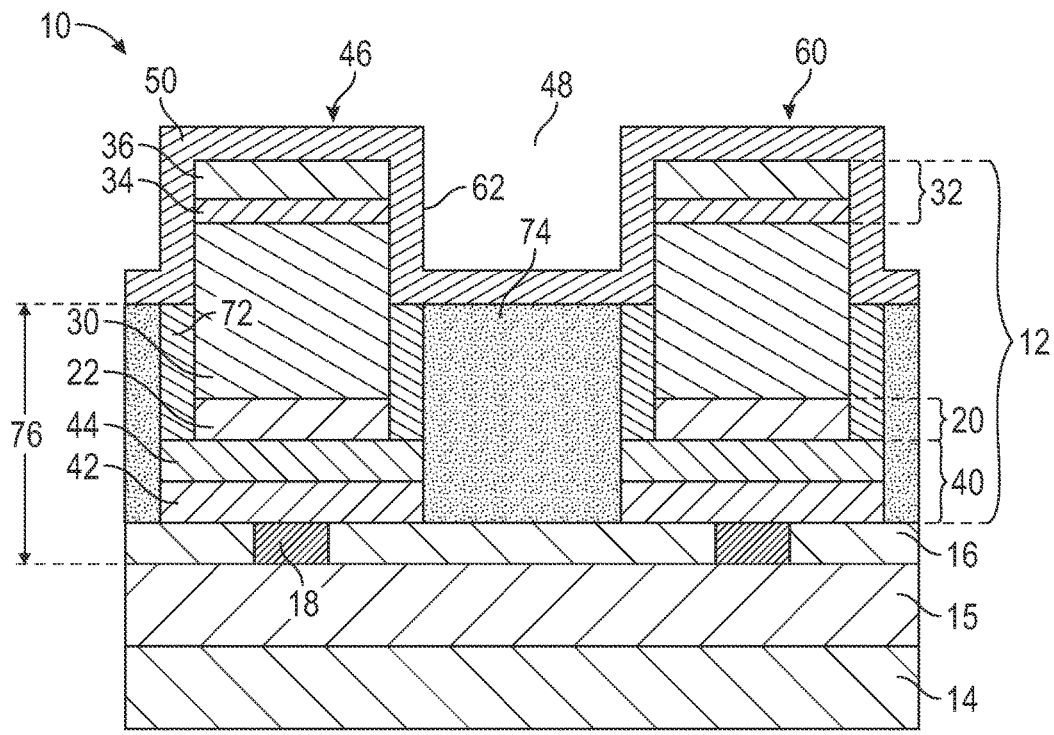
Figure 16:
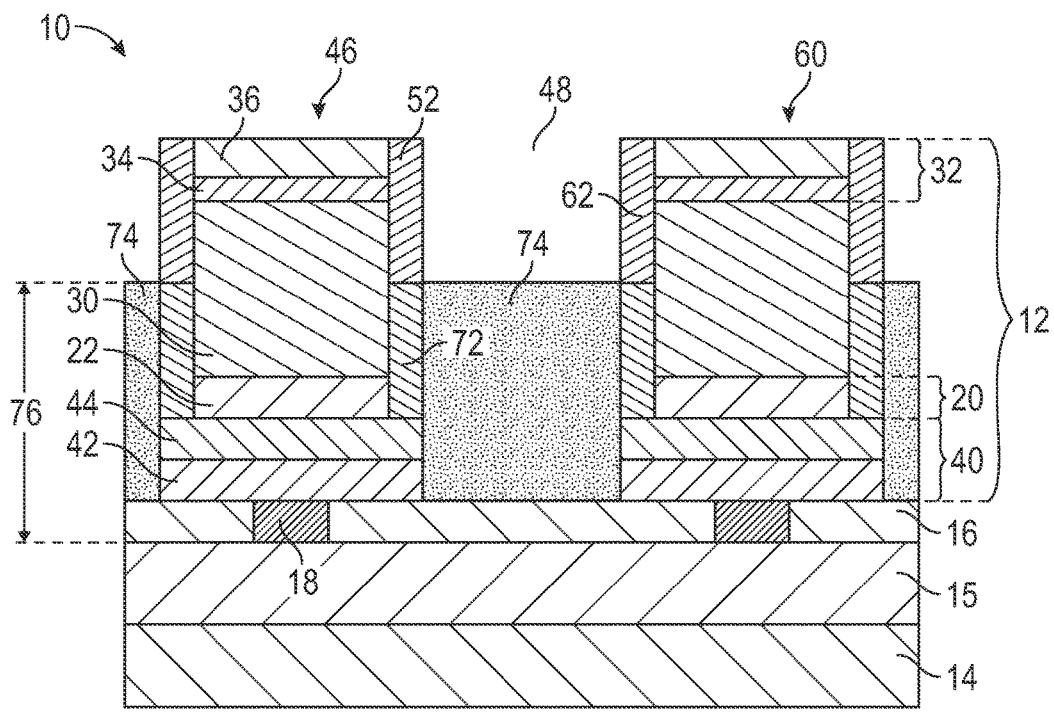

Referring to FIG. 14, the heater spacer 72 is removed from over the heater insulator 74, so the heater spacer 72 extends along the side surface 62 of the stack 12 to the heater height 76. The heater spacer 72 may be removed with a selective etch, such as a wet etch using an acid. The heater spacer 72 below the heater height 76 is protected from the wet etch by the heater insulator 74. The phase change spacer precursor layer 50 may then be formed overlying the stack 12 and the heater insulator 74, such that the phase change spacer precursor layer 50 is in electrical contact with the top of the heater spacer 72 at the heater height 76, as illustrated in an exemplary embodiment in FIG. 15 and as described above. The horizontal portions of the phase change spacer precursor layer 50 may then be removed to form the phase change spacer 52 adjacent to the side surface 62 of the memory cell 60 and overlying the heater spacer 72, as illustrated in FIG. 16 and as described above. As such, the phase change spacer 52 is electrically connected to the upper electrode 32 along the stack side surface 62. The memory cell 60 can then be formed by dividing the row 46 as described above. An exemplary embodiment of the memory cell 60 with the heater spacer 72 also includes four side surfaces 62 with the heater spacer 72 and the phase change spacer 52 adjacent to the same one of the four side surfaces 62, as described above. The upper dielectric layer 36 may be removed and replaced with an upper metallic layer 38 (illustrated in FIG. 11), also as described above, where the upper dielectric layer 36 serves as a placeholder for the final upper metallic layer 38.

The heater spacer 72 has a higher resistivity than the phase change spacer 52, at least when the phase change spacer 52 is in the low resistivity state (crystalline state for GST phase change material). Therefore, the heater spacer 72 will heat to a desired temperature with a lower current density than a phase change spacer 52 of the same horizontal cross sectional area. Heat will flow from the heater spacer 72 to the phase change spacer 52 by conduction, so a lower current density can be used to control the temperature and change the state of the phase change spacer 52 than for a similar memory cell with a phase change spacer 52 but without a heater spacer 72. However, the memory cell 60 can be manufactured with or without the heater spacer 72, and the memory cell 60 will require a lower current density to control the temperature and change the state of the phase change material in either embodiment as compared to a memory cell with phase change material filling the entire space between the upper and lower electrodes 32, 20.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a lower electrode overlying a substrate;
   an insulating layer overlying the lower electrode;
   an upper electrode overlying the insulating layer, such that the lower electrode, the insulating layer, and the upper electrode comprise a stack having a side surface;
   a phase change spacer adjacent to the side surface, wherein the phase change spacer is electrically connected to the lower electrode and the phase change spacer is directly connected to the upper electrode; and
   a heater spacer adjacent to the side surface of the stack, wherein the phase change spacer and the heater spacer are electrically connected, and wherein the heat spacer is directly connected to the lower electrode.

2. The integrated circuit of claim 1 further comprising:
   a base layer underlying the lower electrode wherein the phase change spacer terminates over the base layer.

3. The integrated circuit of claim 2 wherein the base layer comprises an N-polysilicon layer and a P-polysilicon layer.

4. The integrated circuit of claim 1 wherein the phase change spacer comprises germanium antimony tellurium.

5. The integrated circuit of claim 1 wherein the lower electrode comprises a lower phase change layer and a lower metallic layer.

6. The integrated circuit of claim 1 wherein the upper electrode comprises an upper phase change layer and an upper metallic layer.

7. The integrated circuit of claim 1 wherein the stack comprises four side surfaces, and wherein the phase change spacer is adjacent to one of the four side surfaces.

8. The integrated circuit of claim 1 wherein:
   the phase change spacer overlies the heater spacer.

9. The integrated circuit of claim 1 wherein the heater spacer extends to a heater height between the upper electrode and the lower electrode, and wherein the phase change spacer is directly connected to the heater spacer at the heater height.

10. The integrated circuit of claim 1 wherein the heater spacer and the phase change spacer are adjacent to the same side surface of the stack.

11. The integrated circuit of claim 10 wherein the stack comprises four side surfaces, and wherein the heater spacer and the phase change spacer are adjacent to one of the four side surfaces.

12. The integrated circuit of claim 1 wherein the phase change spacer is electrically connected to the lower electrode through the heater spacer.

13. The integrated circuit of claim 8 wherein a resistivity of the heater spacer is higher than the resistivity of the phase change spacer.

14. The integrated circuit of claim 1 further comprising a connecting line underlying the stack.

15. The integrated circuit of claim 1 further comprising:
   a cover layer overlying a memory cell, wherein the stack and the phase change spacer comprise the memory cell, and wherein the cover layer comprises an insulating material.

16. The integrated circuit of claim 15 wherein the cover layer comprises a different material than the insulating layer.

* * * * *